(12) United States Patent
Wagner

(10) Patent No.: US 8,796,157 B2
(45) Date of Patent: Aug. 5, 2014

(54) METHOD FOR SELECTIVE ETCHING

(75) Inventor: Gerald Wagner, Velden (AT)

(73) Assignee: Lam Research AG, Villach (AT)

( * ) Notice: Subject to any disclaimer, the term of this patent is extended or adjusted under 35 U.S.C. 154(b) by 440 days.

(21) Appl. No.: 11/662,092

(22) PCT Filed: Sep. 1, 2005

(86) PCT No.: PCT/EP2005/054291
§ 371 (c)(1),
(2), (4) Date: Mar. 7, 2007

(87) PCT Pub. No.: WO2006/027332
PCT Pub. Date: Mar. 16, 2006

(65) Prior Publication Data
US 2008/0038932 A1 Feb. 14, 2008

(30) Foreign Application Priority Data
Sep. 9, 2004 (AT) ................ A 1506/2004

(51) Int. Cl.
*C03C 15/00* (2006.01)
*C03C 25/68* (2006.01)
*H01L 21/302* (2006.01)
*H01L 21/461* (2006.01)

(52) U.S. Cl.
USPC ........... 438/753; 438/689; 438/745; 438/748; 216/83; 216/92

(58) Field of Classification Search
USPC ...................................... 438/753
See application file for complete search history.

(56) References Cited

U.S. PATENT DOCUMENTS

| 5,032,217 | A | * | 7/1991 | Tanaka ............ 216/91 |
| 6,123,865 | A | * | 9/2000 | Lin et al. .......... 216/91 |
| 6,162,739 | A | * | 12/2000 | Sumnitsch et al. ......... 438/745 |
| 6,603,156 | B2 | | 8/2003 | Rim |
| 7,179,753 | B2 | | 2/2007 | Kruwinus et al. |
| 2003/0235985 | A1 | * | 12/2003 | Christenson et al. ........ 438/689 |
| 2005/0092351 | A1 | * | 5/2005 | Saito et al. ............... 134/33 |
| 2007/0158307 | A1 | * | 7/2007 | Kraus et al. .............. 216/83 |

FOREIGN PATENT DOCUMENTS

| JP | 10270414 A | 10/1998 |
| JP | 11162930 A | 6/1999 |
| JP | 2002336761 A | * 11/2002 | ............. B05C 11/08 |
| JP | 2003526273 A | 9/2003 |
| JP | 2007522663 A | 8/2007 |
| WO | 0199169 A2 | 12/2001 |

OTHER PUBLICATIONS

T.K. Carns et al, Chemical Etching of Si1-xGex in HF;H2O2:CH3COOH, Apr. 1995, Journal of the Electrochemical Scoiety, vol. 142, No. 4, pp. 1260-1266.*

(Continued)

*Primary Examiner* — Nadine Norton
*Assistant Examiner* — Stephanie Duclair
(74) *Attorney, Agent, or Firm* — Young & Thompson

(57) ABSTRACT

Method of selectively etching a first material on a substrate with a high selectivity towards a second material by flowing a liquid etchant across a substrate surface at a flow sufficiently fast to generate a minimum mean velocity parallel to the substrate's surface, wherein the first material is selected from a group including materials with semiconducting properties based on at least two different chemical elements.

11 Claims, 2 Drawing Sheets

(56) References Cited

OTHER PUBLICATIONS

Borel et al, Isotropic ethcing of SiGe Alloys with High Selectivity to Similar Materials, Mar. 14, 2004, Microelectronic Engineering 73-74, pp. 301-305.*

Taraschi et al, Strained Si, SiGe, asnd Ge on insulator: review of wafer bonding fabrication techniques, Apr. 2004, Solid State Electronics, vol. 48, pp. 1297-1305.*

* cited by examiner

Fig. 1
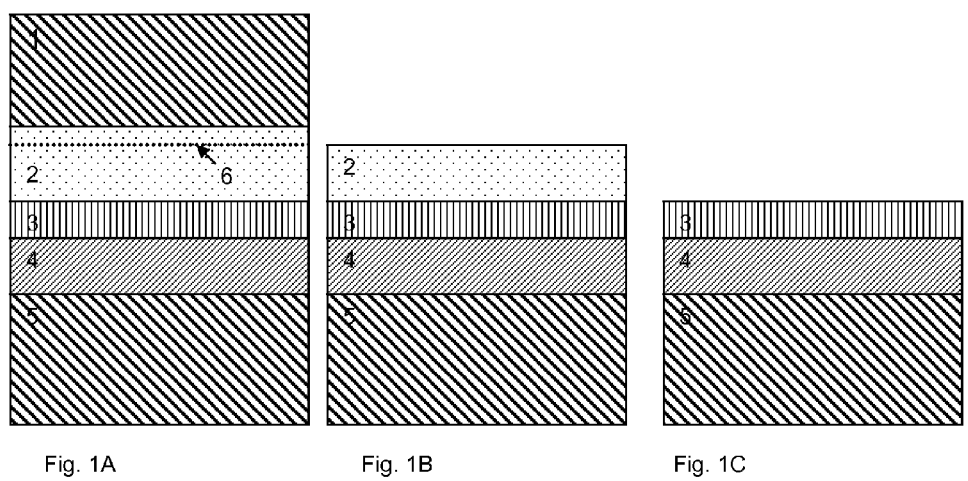
Fig. 1A
PRIOR ART
Fig. 1B
Fig. 1C
Fig. 2
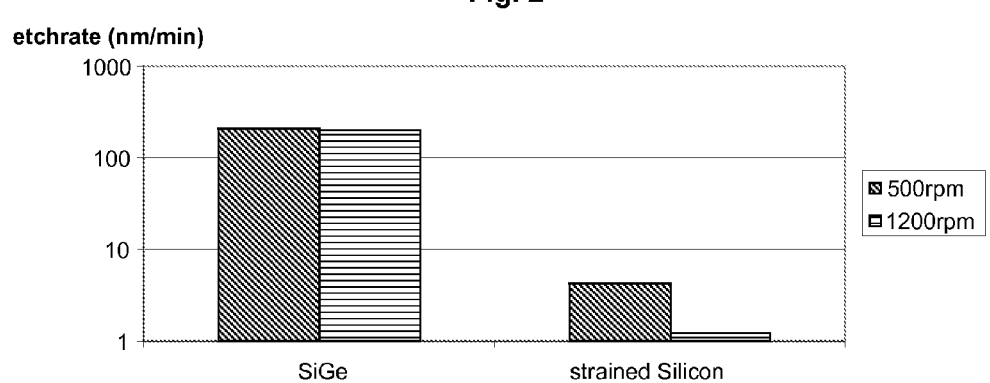

METHOD FOR SELECTIVE ETCHING

CROSS-REFERENCE TO RELATED APPLICATIONS

The present application incorporates by reference and claims benefit of priority to PCT/EP2005/054291 filed Sep. 5, 2005 and Austrian Patent Application A1506/2004 filed Sep. 9, 2004.

STATEMENT REGARDING FEDERALLY SPONSORED RESEARCH OR DEVELOPMENT

None.

THE NAMES OF THE PARTIES TO A JOINT RESEARCH AGREEMENT

None.

INCORPORATION-BY-REFERENCE OF MATERIAL SUBMITTED ON A COMPACT DISC

None.

BACKGROUND OF THE INVENTION

1. Field of the Invention

The invention relates to a method of selective etching a first material on a substrate with a high selectivity towards a second material.

2. Description of Related Art

Such a selective etching can be used in semiconductor device manufacturing process or semiconductor substrate manufacturing process. Hence said substrate may be a semiconductor wafer.

The process may be used for successful integration of thin monocrystalline semiconductor layers like strained silicon. A thin layer of SiGe can be used as substrate for epitaxial growth of strained silicon. Since Ge has bigger atoms than Si, the lattice constant of SiGe alloys can be adjusted by the Ge content. The typical Ge content is 20-30 atom % for the usage of SiGe as substrate for growing strained silicon. SiGe thereafter is removed, thus having the role of a sacrificial layer. The remaining strained silicon has advanced electrical properties, with electrons and holes flowing faster leading to a 20-30% increase in transistor performance. Strained silicon is also used in combination with the Silicon-On-Insulator (SOI) technology, thus forming strained-SOI. SOI-based chips are using a thin insulation layer (typically silicon oxide) under the monocrystalline silicon surface, thus allowing higher speeds with less electrical loss.

Such a process is described in U.S. Pat. No. 6,603,156 as follows: A SOI structure and a method for its fabrication, in which a strained silicon layer lies directly on an insulator layer, contrary to the prior requirement for strained-Si layers to lie directly on a strain-inducing (e.g., SiGe) layer. The method generally entails the forming a silicon layer on a strain-inducing layer so as to form a multilayer structure, in which the strain-inducing layer has a different lattice constant than silicon so that the silicon layer is strained as a result of the lattice mismatch with the strain-inducing layer. The multilayer structure is then bonded to a substrate so that an insulating layer is between the strained silicon layer and the substrate, and so that the strained silicon layer directly contacts the insulating layer. The strain-inducing layer is then removed to expose a surface of the strained silicon layer and yield a strained silicon-on-insulator structure that comprises the substrate, the insulating layer on the substrate, and the strained silicon layer on the insulating layer. As a result, the method yields a strained silicon-on-insulator (SSOI) structure in which the strain in the silicon layer is maintained by the SOI structure. A therein disclosed method for completely removing the SiGe substrate is by a selective chemical etching process such as HHA (hydrogen peroxide, hydrofluoric acid, acetic acid) etching, which etches the SiGe substrate.

Typical layer thicknesses are 100 nm for SiGe and 20 nm for strained silicon. The sacrificial SiGe layer typically is removed by wet chemical etching. Etching with high selectivities is preferred to keep the strained silicon loss as low as possible.

As described in G. Chang, T. Carns, S. Rhee, K. Wang, J. Electrochem. Soc., Vol. 138, No. 1, 202-4, wet etchants of SiGe typically comprise an oxidizing agent like $H_2O_2$ or $HNO_3$ and a silicon complexing agent like HF or $NH_4OH$. To achieve higher selectivities, etchants are diluted with water, or moderators like acetic acid or phosphoric acids are added. High efforts have been made to increase etchrate and selectivity of etching SiGe towards Si or strained Si. Proposed methods for increasing this selectivity comprise adding moderators like acetic acid.

BRIEF SUMMARY OF THE INVENTION

An object of the invention is to provide a method for etching a first material with semiconducting properties based on at least two different chemical elements (e.g. SiGe) on a substrate with a high selectivity towards a second material (e.g. silicon (e.g. bulk silicon, polycrystalline silicon, strained silicon) or metal silicides (e.g. nickel silicide, cobalt silicide, platinum silicide)). In other words said first material shall be effectively removed from said second material without significantly affecting said second material. Hereby it does not make any difference whether said first material has been disposed on said second material or said second material has been disposed on said first material. For instance silicon might have been disposed on SiGe in order to achieve strained silicon.

Another object of the invention is to provide selectivity against all other materials especially insulating materials such as thermally produced silicon oxide (Thermal Oxide abbreviated THOX) and silicon nitride.

The invention meets the objects by providing a method of selective etching comprising:
  providing a first material selected from a group A on a substrate, said group A comprises materials with semiconducting properties based on at least two chemical elements
  providing a second material selected from a group B on a substrate
  selectively etching said first material with a selectivity of at least 15:1 towards said second material by a liquid etchant flowing across the substrate surface at a flow sufficient fast to generate a mean velocity v parallel to the substrate's surface of minimum 0.1 m/s. A preferred velocity v is above 0.5 m/s.

The first material is different from the second material either in chemical composition or crystalline structure or in both.

The minimum velocity can be generated with a closed flow as follows:
  providing a plate substantially parallel to the substrate (wafer) and thereby generating a gap between said substrate and said plate with a gap distance d, introducing said liquid etchant into the gap so that both the substrate surface (facing the plate) and the plate surface (facing the substrate) are wetted, introducing said liquid etchant into the gap at a velocity v.

For a given cross sectional area (a) of the gap the necessary volume flow (Q) can be selected to achieve the minimum velocity. For instance a substrate diameter of 0.2 m (e.g. a 200 mm wafer) and a gap distance d=1 mm leads to a minimum volume flow of 2E-5 $m^3/s$ (=1.2 l/min).

Another possibility for generating a flow with minimum velocity across the wafer is to dispense the etchant onto the substrate with a free beam at such a minimum velocity. This is because liquid, which is dispensed as a free beam, is guided into a direction parallel to the substrate's surface substantially without any decrease of velocity. Liquid, which is dispensed as a free beam out of a nozzle with a velocity v0, is further accelerated or decelerated depending on whether liquid is dispensed from above or from below onto the substrates surface according to the following equation, wherein va is the velocity of the liquid when touching the wafer.

Liquid dispensed from above:

$$va^2=v0^2+2gl$$

Liquid dispensed from below:

$$va^2=v0^2-2gl$$

va . . . velocity of the liquid when touching the wafer
v0 . . . velocity of the liquid when leaving the dispensing nozzle
g . . . acceleration due to gravity
l . . . height difference between nozzle and surface of the substrate.

Liquid, which is dispensed onto a substrate through a free beam, has a flow in a shooting state when flowing across the substrate's surface. This is described by Froude Number of greater 1 ($Fr=v^2/(g*h)$; wherein v is the velocity of the liquid flowing across the substrate, g is the acceleration due to gravity and h is the height of the liquid film flowing across the substrate).

It was discovered that the selectivity of an etching process can be significantly increased by using the invented method compared to known selective etching processes where substrates are immersed into the etching liquid. Without being bound to any theory it is believed that the reason of the significant increase of the selectivity by the high velocity is a very thin diffusion layer and/or the fast transport of reaction products and/or by products away from the place of reaction.

In a preferred embodiment the liquid is dispensed onto the substrate in a continuous flow and spread over the substrate's surface. Such a continuous flow can be achieved through a media nozzle dispensing said liquid in a free beam.

Another embodiment uses a method wherein the point of impact of the liquid stream is moved across the surface of the substrate in a time sequence. The point of impact shall be defined as intersection between the surface of the substrate and the axis of the free beam of the liquid. If the substrate is rotated and the liquid is dispensed through a nozzle on a media arm said point of impact will be moved by moving the media arm across the substrate. This moving of the point of impact results in a better uniformity.

Although the velocity is not primarily depending on the volume flow a minimum flow is useful in order to evenly cover the substrate when liquid is dispensed on it. A volume flow of at least 0.05 l/min (especially at least 0.5 l/min) is preferred.

Rotating said substrate while being exposed to said liquid etchant helps to keep the necessary minimum velocity of the liquid on the substrate. This could be necessary if the liquid is dripped onto the substrate. Another advantage for rotating said substrate is to fling the liquid off the substrate. Thus the liquid might be collected by a surrounding bowl and recycled. It is preferred to rotate the substrate at a spin speed of more than 50 revolutions per minute (rpm) especially more than 300 rpm. This helps to further increase selectivity of the etching method.

In a preferred method the abovementioned group A comprises materials with semiconducting properties based on at least two different chemical elements, wherein at least one of said elements is selected from metals and/or semimetals (e.g. B, Si, Ge, As, Sb, Te, Bi, Po) and/or Se and another of said elements is selected from semimetals and/or Se. Such materials are e.g. silicon germanium (SiGe) with varying germanium content, tin silicide (SnSi), titan silicide ($Ti_2Si$), nickel silicide, cobalt silicide, platinum silicide or other materials as mentioned above.

Group B preferably comprises materials with semiconducting properties, like silicon (e.g. bulk silicon, polycrystalline silicon, strained silicon, silicon-on-insulator, strained-silicon-on-insulator), or silicides (e.g. tin silicide (SnSi), titan silicide ($Ti_2Si$), nickel silicide, cobalt silicide, platinum silicide or other materials). The method according to the invention is especially useful for etching a first material selectively towards silicon especially when a liquid etchant comprising an oxidizer and fluoride ions is used.

In one embodiment of the method first material is used as substrate for growing said second material (e.g. as a strain-inducing layer for growing strained silicon). Optionally said first material is used as sacrificial layer to be removed selectively from said second material.

Yet another preferred embodiment of the method uses liquid etchant, which consists of:
- a compound comprising fluorine, like hydrofluoric acid (HF), ammonium fluoride ($NH_4F$), ammonium hydrogen difluoride ($NH_4HF_2$), fluoroboric acid ($H_2BO_2F$), fluorosulphonic acid ($HSO_3F$);
- an oxidizing agent, like nitric acid ($HNO_3$), nitrous acid ($HNO_2$), hydrogen peroxide ($H_2O_2$), ozone ($O_3$), perchloric acid ($HClO_4$), per carboxylic acid (e.g. peracetic acid, perpropanoic acid);
- optionally one or more compounds allowing the control of the diffusion layer, the surface tension of the mixture, or wetability of the wafer surface, like anorganic oxygen containing acid (e.g. phosphoric acid ($H_3PO_4$), sulphuric acid ($H_2SO_4$)), an carboxylic acid (e.g. acetic acid, propanoic acid, a dicarboxylic acid (e.g. oxalic acid, malonic acid), a aromatic carboxylic acid (e.g. bencoic acid), a hydroxy carboxylic acid (e.g. tartaric acid, citric acid)), a per carboxylic acid (e.g. peracetic acid, perpropanoic acid), an carboxylic ester (e.g. ethyl acetate), a carboxylic perester (e.g. ethyl peracetate), a carboxylic amid (e.g. dimethyl acetamide), or a dipolar solvent (e.g. dimethyl sulfoxide, N-methyl-pyrrolidone).

BRIEF DESCRIPTION OF THE SEVERAL VIEWS OF THE DRAWINGS

Further details and advantages of the invention can be realized from the drawings and detailed description of a preferred embodiment.

FIG. 1 shows a schematic drawing of a substrate, to which a method of the invention is applied, wherein FIG. 1A shows an initial wafer, FIG. 1B a wafer after wafer split (e.g. through SmartCut) and FIG. 1C the wafer after having selectively removed a SiGe layer.

FIG. 2 and FIG. 3 show charts of etch rates for different materials comparing different methods.

DETAILED DESCRIPTION OF THE INVENTION

Figure 3:
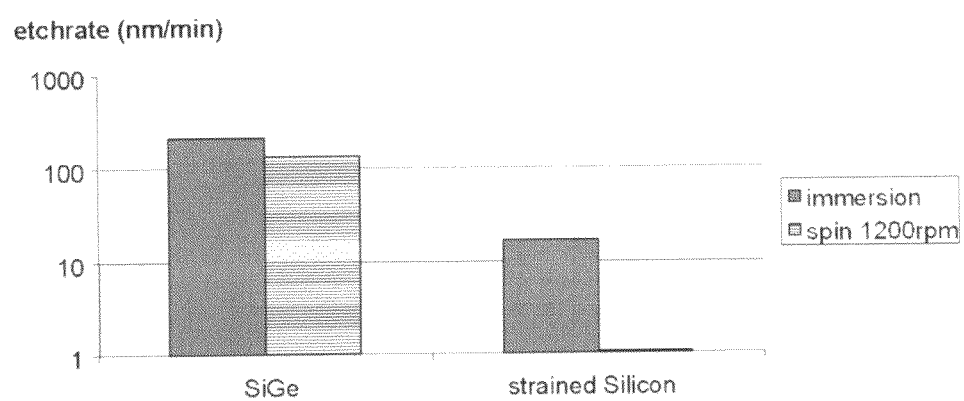

A preferred embodiment of the method shall be described for selectively removing SiGe from strained Silicon-on-Insulator. FIG. 1 shows a schematic drawing of a substrate during manufacture strained Silicon-on-Insulator wafers. SiGe 2 is manufactured on bulk silicon 1, and Si is deposited on SiGe 2, thus forming a layer of strained silicon 3 on SiGe 2. The wafer comprising materials 1, 2 and 3 is bonded to another wafer comprising thermal silicon oxide 4 on bulk silicon 5. After bonding, the bulk silicon 1 is split off. One usual method of splitting comprising the introduction of hydrogen ions 6 inside the SiGe 2 is disclosed in U.S. Pat. No. 6,225,192. Such hydrogen ions have been implanted into SiGe before strained silicon layer is formed on SiGe. After bonding the two wafers together the wafer is cut at the layer of implanted hydrogen inside SiGe through a thermal treatment leaving a wafer with an exposed SiGe 2 layer on strained silicon 3 (FIG. 1B).

The method according to the current invention is then used to selectively remove SiGe 2 from strained silicon 3 leading to a wafer with an exposed silicon layer (in this case strained silicon layer 3) as shown in FIG. 1C.

Studies have been made to compare etch rate of different materials using different etching techniques. FIG. 2 shows a chart of etch rates of different materials, which are SiGe 1 and strained silicon 2. Different methods have been compared, which are immersion of the substrate in an etch bath and dispensing the etchant in a continuous flow (free beam) onto a rotating wafer (500 and 1200 rpm) in a spin processor. The etchant is an aqueous composition comprising HF (8.2 mol/l), $H_2O_2$ (2.9 mol/l), and propanoic acid (4.5 mol/l). For the experiments a temperature of 25° C. has been used.

As can be seen on the chart of FIG. 2, etch rate of strained silicon decreases when using a high angular velocity. Whereas the etch rate of SiGe decreases only by a factor 1.05, the etch rate of strained silicon decreases by a factor 3.5. Hence the etch selectivity of SiGe towards strained silicon increased from 49:1 to 165:1. This improvement of selectivity of a factor 3.4 is extraordinary, when keeping temperature and composition of the etchant unchanged.

In a preferred embodiment a mixture of water, HF (2.7 mol/l), $H_2O_2$ (3.9 mol/l), and acetic acid (7.4 mol/l) was used at 40° C.

The chart in FIG. 3 shows a decrease of the etch rate of SiGe and strained silicon when using a high flow across the rotating substrate (1200 rpm). The etch selectivity of SiGe towards strained silicon increased from 12:1 (immersed in an etching bath) to 128:1 (using a high flow across the substrate in a spin processor).

The invention claimed is:

1. A method of selective etching comprising:
   providing a substrate comprising a surface layer formed by first material and an intermediate layer formed by a second layer, said intermediate layer immediately adjacent to said surface layer and between said substrate and said surface layer, said first material comprising at least two different chemical elements and having semiconducting properties based on said at least two different chemical elements, and said second material being strained silicon; and
   providing strained silicon as a second material selected; and
   selectively etching said first material with a selectivity of at least 15:1 towards said second material by a liquid etchant flowing across and directly contacting the substrate surface layer at a flow sufficiently fast to generate a mean velocity v parallel to the substrate's surface layer of at least 0.1 m/s,
   wherein said substrate is rotated while exposed to said liquid etchant,
   wherein said liquid is dispensed onto the surface layer of the substrate in a continuous flow as a free beam having a defined axis such that the liquid contacts the substrate's surface at a point of impact defined as an intersection of the axis of the free beam and the substrate's surface, and the liquid is spread over the substrate's surface layer from said point of impact,
   wherein said point of impact of the liquid stream is moved across the surface layer of the substrate in a time sequence so as to provide uniform etching,
   wherein said liquid is dispensed at a volume flow from 0.05 l/min to 0.5 l/min.

2. The method of claim 1, wherein at least one of said elements of said first material is selected from at least one of metals, semimetals and Se, and another of said elements is selected from an other group,
   wherein the other group is selected from the group of B, Si, Ge, As, Se, Sb, Te, Bi and Po.

3. The method of claim 1, wherein said first material is used as substrate for growing said second material.

4. The method of claim 1, wherein said first material is used as sacrificial layer to be removed selectively from said second material.

5. The method of claim 1, wherein said liquid etchant comprises
   a compound comprising fluorine, selected from the group consisting of hydrofluoric acid (HF), ammonium fluoride ($NH_4F$), ammonium hydrogen difluoride ($NH_4HF_2$), fluoroboric acid ($H_2BO_2F$), and fluorosulphonic acid ($HSO_3F$);
   an oxidizing agent, selected from the group consisting of nitric acid ($HNO_3$), nitrous acid ($HNO_2$), hydrogen peroxide ($H_2O_2$), ozone ($O_3$), perchloric acid ($HClO_4$) and per carboxylic acid.

6. The method of claim 5, wherein said liquid etchant further comprises one or more additives allowing the control of the diffusion layer, the surface tension of the mixture, or wetability of the wafer surface, selected from the group consisting of anorganic oxygen containing acid, a carboxylic acid, dicarboxylic acid, aromatic carboxylic acid, hydroxy carboxylic acid, a per carboxylic acid, a carboxylic ester, a carboxylic perester a carboxylic amid or a dipolar solvent.

7. The method of claim 1, wherein the first material is silicon germanium (SiGe) with varying germanium content.

8. The method of claim 1, wherein the point of impact of the liquid stream is moved across the surface of the substrate by moving a point from which the liquid stream is dispensed.

9. The method of selective etching according to claim 1, wherein the substrate is rotated to increase selectivity of etching.

10. A method of selective etching comprising:
    providing on a substrate comprising a surface layer of a first material and a layer of a second material immediate adjacent to said surface layer,
    said first material having semiconducting properties and being based on at least two different elements: (i) one being at least one of metals, semimetals and Se, and (ii) one being at least one element selected from the group consisting of B, Si, Ge, As, Se, Sb, Te, Bi and Po,
    said second material being strained silicon; and selectively etching said first material with a selectivity of at least 15:1 towards said second material by contacting the substrate surface layer with a liquid etchant, said liquid etchant flowing across the substrate surface layer at a flow sufficiently fast to generate a mean velocity v parallel to the substrate's surface of minimum 0.1 m/s, wherein the liquid etchant comprises a (a) a source of fluorine selected from the group consisting of hydrofluoric acid (HF), ammonium fluoride ($NH_4F$), ammonium hydrogen difluoride ($NH_4HF_2$), fluoroboric acid ($H_2BO_2F$), and fluorosulphonic acid ($HSO_3F$), and (b) an oxidizing agent selected from the group consisting of nitric acid ($HNO_3$), nitrous acid ($HNO_2$), hydrogen peroxide ($H_2O_2$), ozone ($O_3$), perchloric acid ($HClO_4$) and percarboxylic acid, wherein said substrate is rotated while exposed to said liquid etchant, wherein said liquid is dispensed from a location onto the surface layer of the substrate in a continuous flow as a free beam having a defined axis such that the liquid contacts the substrate's surface at a point of impact defined as an intersection of the axis of the free beam and the substrate's surface, and the liquid is spread over the substrate's surface layer from said point of impact, wherein said point of impact of the liquid stream is moved across the surface layer of the substrate in a time sequence by moving the location from which the liquid stream is dispensed to provide uniform etching, wherein said liquid is dispensed at a volume flow from 0.05 l/min to 0.5 l/min.

11. The method of selective etching according to claim 10, wherein the substrate is rotated at more than 50 revolutions per minute to increase selectivity of etching.

* * * * *